(12) United States Patent
Kim et al.

(10) Patent No.: US 7,382,309 B2
(45) Date of Patent: Jun. 3, 2008

(54) ANALOG LEVEL METER AND METHOD OF MEASURING ANALOG SIGNAL LEVEL

(75) Inventors: Je-Kook Kim, Yongin-si (KR); Jun-Ho Huh, Yongin-si (KR); Sang-Hoon Moon, Suwon-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 0 days.

(21) Appl. No.: 11/652,553

(22) Filed: Jan. 12, 2007

(65) Prior Publication Data

US 2007/0164886 A1    Jul. 19, 2007

(30) Foreign Application Priority Data

Jan. 16, 2006    (KR)    ...................... 10-2006-0004442

(51) Int. Cl.
*H03M 1/34*    (2006.01)

(52) U.S. Cl. ...................................... 341/164; 341/155

(58) Field of Classification Search ......... 341/130–170
See application file for complete search history.

(56) References Cited

U.S. PATENT DOCUMENTS 7,049,752 B2 *    5/2006    Tani et al. .................. 340/475

FOREIGN PATENT DOCUMENTS

| JP | 56-157123 | 12/1981 |
|----|-----------|---------|
| JP | 05-122519 | 5/1993 |
| JP | 06-334521 | 12/1994 |
| JP | 2004-282547 | 10/2004 |

* cited by examiner

*Primary Examiner*—Lam T. Mai
(74) *Attorney, Agent, or Firm*—Harness, Dickey & Pierce, P.L.C.

(57) ABSTRACT

An analog level meter and a method of measuring an analog signal level may be provided. The analog level meter may include a comparator, a duty counter, an analog level detector and/or a digital to analog converter (DAC). The comparator may compare a voltage level of the analog signal with a reference voltage and generate an up-down signal. The duty counter may count a duty value of the up-down signal. The analog level detector may output a duty error value obtained by subtracting a target duty value from the duty value of the up-down signal. The analog level meter may output the reference voltage as a measured value of the analog signal when the duty error value is a desired or predetermined value.

18 Claims, 4 Drawing Sheets

ANALOG LEVEL METER AND METHOD OF MEASURING ANALOG SIGNAL LEVEL

PRIORITY STATEMENT

This application claims the benefit of priority to Korean Patent Application No. 10-2006-0004442, filed on Jan. 16, 2006, in the Korean Intellectual Property Office, the entire contents of which is incorporated herein in its entirety by reference.

BACKGROUND

1. Field

Example embodiments relate to an analog level meter and a method of measuring analog signal level, and for example, to an analog level meter using duty ratio capable of detecting an analog peak/bottom level without an analog to digital converter and a method of measuring analog signal level using duty ratio capable of the same.

2. Description of Related Art

An analog level meter may include an analog to digital converter (ADC) to convert an analog signal into a digital signal. However, when a frequency of the analog signal is higher than a sampling frequency of the ADC, sampling may not be performed properly. Accordingly, it may be necessary to adjust a level of an input analog signal to improve the operation of the ADC.

FIG. 1 is an example diagram showing a conventional analog level meter with an analog to digital converter ADC.

Referring to FIG. 1, the conventional analog level meter 10 may include an offset control unit 11, a gain control unit 12, a peak/bottom detector 13 and/or an analog to digital converter ADC 14.

The offset control unit 11 and/or the gain control unit 12 may control an offset and/or a gain of the analog signal to adjust the level of the analog signal to a level at which the ADC operates properly. The peak/bottom detector 13 may detect a peak value and/or a bottom value of the analog signal of which the level may be adjusted.

FIGS. 2A and 2B are example circuit diagrams showing a conventional peak/bottom detector.

Referring to FIGS. 2A and 2B, the peak/bottom detector 13 may include an operational amplifier (op amp). The non-inverting terminal of the op amp may receive the analog signal, and the inverting terminal of the op amp may receive the output of the op amp by feedback. The peak/bottom detector 13 may detect the peak value or the bottom value by limiting a source current or a sink current of the op amp.

Referring to FIG. 1, the ADC 14 may perform analog to digital conversion with respect to the detected peak value and/or bottom value.

However, the conventional analog level meter may have to include the offset control unit and/or the gain control unit to adjust the level of the analog signal to the level at which the ADC operates properly. Accordingly, the layout area of the analog level meter may increase. The conventional analog level meter may further include capacitors, which in turn, may increase the number of elements and/or change the characteristics of the capacitors according to processes.

SUMMARY

Example embodiments provide an analog level meter using duty ratio capable of detecting a peak/bottom level of an analog signal without an analog to digital converter.

Example embodiments provide a method of measuring an analog signal level using duty ratio capable of detecting a peak/bottom level of an analog signal without an analog to digital converter.

According to an example embodiment an analog level meter may include a comparator, a duty counter, an analog level detector and/or a digital to analog converter (DAC). The analog meter may use duty ratio.

According to an example embodiment, the comparator may compare a voltage level of an analog signal with a reference voltage and generate an up-down signal. The duty counter may count a duty value of the up-down signal. The analog level detector may output a duty error value obtained by subtracting a target duty value from the duty value of the up-down signal. The DAC may convert the duty error value into another analog signal with a corresponding voltage level and output the converted another analog signal as the reference voltage by feedback.

According to an example embodiment, the analog level meter may output the reference voltage as a measured value of the analog signal if the duty error value is a desired or predetermined value.

According to an example embodiment, the analog level meter may output the reference voltage as a measured value of the analog signal when the duty error value is 0.

According to an example embodiment, when the voltage level of the analog signal is higher than the reference voltage, the up-down signal may be positive, and when the voltage signal of the analog signal is lower than the reference voltage, the up-down signal may be negative.

According to an example embodiment, when the up-down signal is positive, the duty counter may increase the duty value by one, and when the up-down signal is negative, the duty counter may decrease the duty value by one.

According to an example embodiment, the target duty value may be set to correspond to a target voltage of the analog signal to be measured.

According to an example embodiment, the target voltage may be a peak voltage or a bottom voltage of the analog signal.

According to an example embodiment, the duty counter may count in synchronization with a desired or predetermined clock.

According to an example embodiment, the analog level detector may include a subtracter, a low pass filter, and/or a residual accumulation integrator.

According to an example embodiment, the subtracter may output the duty error value obtained by subtracting the target duty value from the duty value of the up-down signal. The low pass filter may filter the duty error value. The residual accumulation integrator may output and hold the filtered duty error value. The low pass filter may set different weights for gains of the low pass filter by comparing the magnitude of the input of the low pass filter with the magnitude of the output of the low pass filter.

According to an example embodiment, the low pass filter may remove ripples of the duty error value.

According to an example embodiment, the analog level meter may further include a latch unit latching the duty value of the up-down signal at each period in response to an update signal and/or an update signal generator generating the update signal at the each period.

According to an example embodiment, the analog level meter may further include a reset unit generating a reset signal for resetting the duty counter at the each period. The reset unit may generate the reset signal by delaying the update signal.

According to an example embodiment a method of measuring a voltage level of an analog signal may include comparing the voltage level of the analog signal with a reference voltage, generating the comparison result as an up-down signal, counting a duty value of the up-down signal, subtracting a target duty value from the duty value of the up-down signal, converting the result of subtracting the target duty value from the duty value of the up-down signal into another analog signal with a corresponding voltage level and outputting the converted analog signal as the reference voltage by feedback, and/or outputting the result of converting the result of subtracting the target duty value from the duty value of the up-down signal into the another analog signal with the corresponding voltage level as a measured value of the analog signal if the result of subtracting the target duty value from the duty value of the up-down signal is a desired or predetermined value.

According to an example embodiment a method of measuring a voltage level of an analog signal may include comparing the voltage level of the analog signal with a reference voltage, generating the comparison result as an up-down signal, counting a duty value of the up-down signal, subtracting a target duty value from the duty value of the up-down signal, converting the result of subtracting the target duty value from the duty value of the up-down signal into another analog signal with a corresponding voltage level and outputting the converted analog signal as the reference voltage by feedback, and/or outputting the reference voltage as a measured value of the analog signal if the result of subtracting the target duty value from the duty value of the up-down signal is a desired or predetermined value.

According to an example embodiment, when the voltage level of the analog signal is higher than the reference voltage, the up-down signal may be positive, and when the voltage level of the analog signal is lower than the reference voltage, the up-down signal may be negative.

According to an example embodiment, in counting a duty value of the up-down signal, when the up-down signal is positive, the duty value of the up-down signal may be increased by one. In the counting a duty value of the up-down signal, when the up-down signal is negative, the duty value of the up-down signal may decreased by one.

According to an example embodiment, counting a duty value of the up-down signal may be synchronized with a desired or predetermined clock.

According to an example embodiment, the target duty value may be set to correspond to a target voltage of the analog signal.

BRIEF DESCRIPTION OF THE DRAWINGS

The above and/or other aspects and advantages will become more apparent and more readily appreciated from the following detailed description of example embodiments taken in conjunction with the accompanying drawings of which.

DETAILED DESCRIPTION OF EXAMPLE EMBODIMENTS

Figure 1:
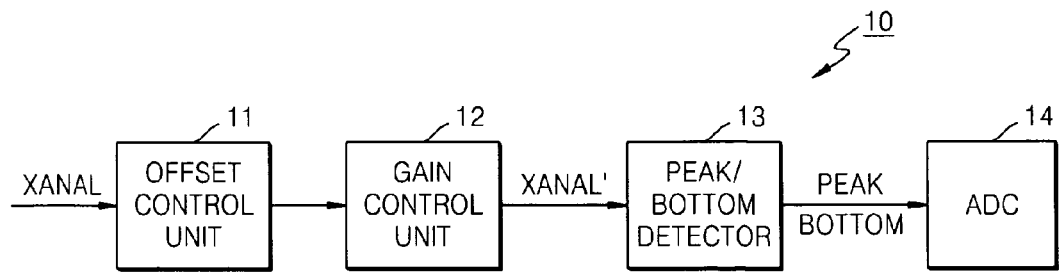
FIG. 1 is an example diagram showing a conventional analog level meter with an analog to digital converter.
Figure 2A:
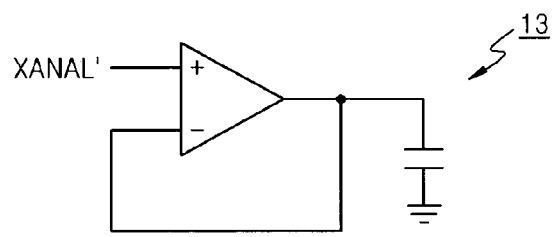
FIGS. 2A and 2B are example circuit diagrams showing a conventional peak/bottom detector.
Figure 2B:
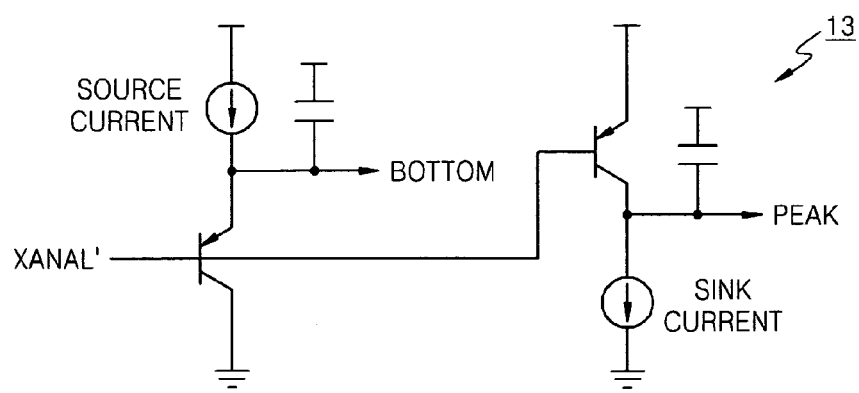

Example embodiments will now be described more fully hereinafter with reference to the accompanying drawings. Embodiments may, however, be in many different forms and should not be construed as being limited to the example embodiments set forth herein. Rather, these example embodiments are provided so that this disclosure will be thorough and complete, and will fully convey the scope to those skilled in the art. In the drawings, the thicknesses of layers and regions may be exaggerated for clarity.

It will be understood that when a component is referred to as being "on," "connected to" or "coupled to" another component, it can be directly on, connected to or coupled to the other component or intervening components may be present. In contrast, when a component is referred to as being "directly on," "directly connected to" or "directly coupled to" another component, there are no intervening components present. As used herein, the term "and/or" includes any and all combinations of one or more of the associated listed items.

It will be understood that, although the terms first, second, third, etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of the example embodiments.

Spatially relative terms, such as "beneath," "below," "lower," "above," "upper" and the like, may be used herein for ease of description to describe one component or feature's relationship to another component(s) or feature(s) as illustrated in the drawings. It will be understood that the spatially relative terms are intended to encompass different orientations of the device in use or operation in addition to the orientation depicted in the figures.

The terminology used herein is for the purpose of describing particular example embodiments only and is not intended to be limiting. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, and/or components.

Unless otherwise defined, all terms (including technical and scientific terms) used herein have the same meaning as commonly understood by one of ordinary skill in the art to which example embodiments belong. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Reference will now be made to example embodiments, which are illustrated in the accompanying drawings, wherein like reference numerals refer to the like components throughout.

Figure 3:
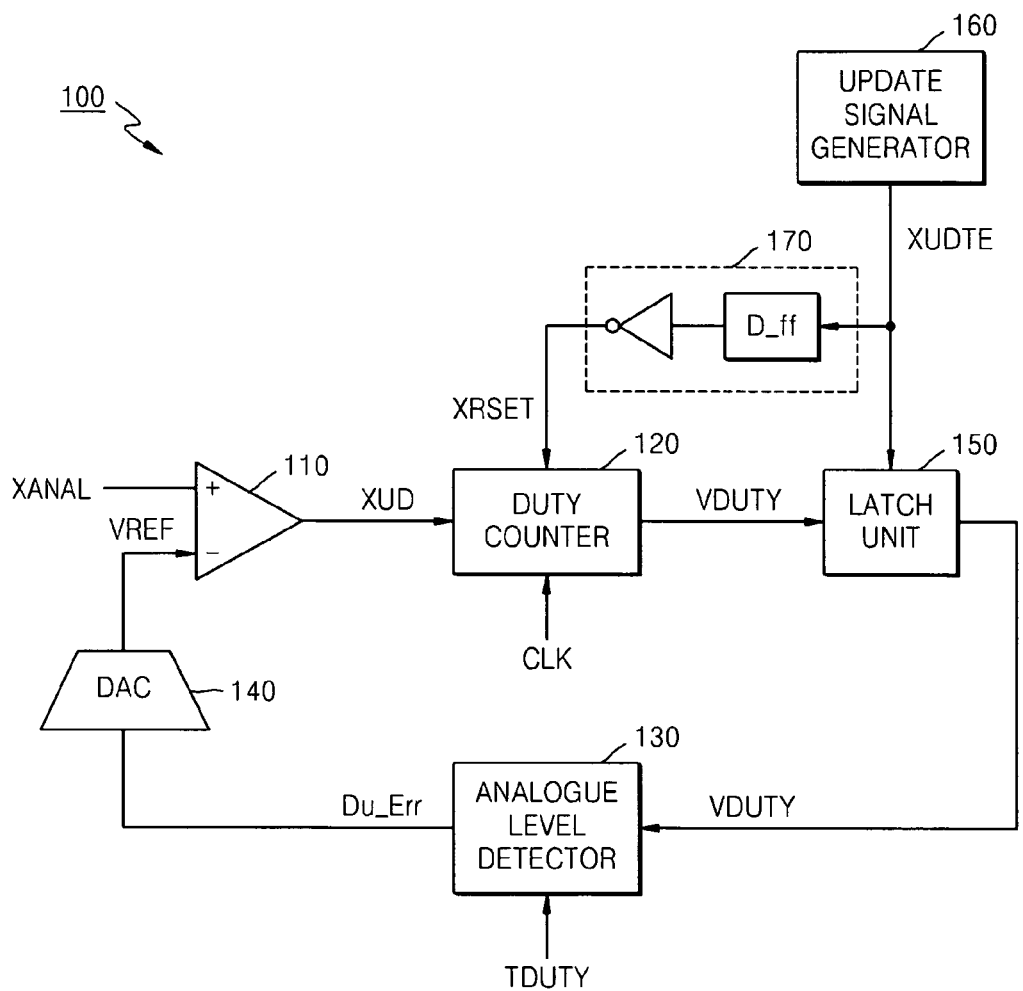
FIG. 3 is a schematic plan view showing an analog level meter using a duty ratio according to an example embodiment.

FIG. 3 is a schematic plan view showing an analog level meter using a duty ratio according to an example embodiment.

Referring to FIG. 3, the analog level meter 100 using a duty ratio according to an example embodiment may include a comparator 110, a duty counter 120, an analog level detector 130 and/or a digital to analog converter (DAC) 140.

The comparator 110 may compare a voltage level of the analog signal XANAL to be measured with a reference voltage VREF and generate an up-down signal XUD. The analog signal XANAL may be input into the anode terminal of the comparator 110 and/or the reference voltage VREF may be input into the cathode terminal of the comparator 110.

Accordingly, when the voltage level of the analog signal XANAL is higher than the reference voltage, the up-down signal XUD may be positive, and when the voltage level of the analog signal XANAL is lower than the reference voltage VREF, the up-down signal XUD may be negative.

The duty counter 120 may count a duty value VDUTY of the up-down signal XUD. When the up-down signal XUD is positive, the duty counter 120 may increase the duty value VDUTY by one in response to the up-down signal XUD. Alternatively, when the up-down signal XUD is negative, the duty counter 120 may decrease the duty value VDUTY by one.

The duty counter 120 may perform the counting in synchronization with a desired or predetermined clock CLK. The duty counter 120 may output the duty value VDUTY of the up-down signal XUD counted for a desired or predetermined period.

Referring to FIG. 3, the analog level meter 100 may further include a latch unit 150 latching the duty value VDUTY of the up-down signal XUD at each period in response to an update signal XUDTE.

The update signal XUDTE may be generated by an update signal generator 160. The update signal XUDTE may be a clock signal to be activated at each period.

The update signal XUDTE may be applied to the duty counter 120 as a reset signal XRSET through conversion. A reset unit 170 may generate the reset signal XRSET by delaying the update signal XUDTE. The duty counter 120 may reset the duty value VDUTY at each period in response to the reset signal XRSET. For example, the reset unit may generate a reset signal for resetting the duty counter after latching.

The duty value VDUTY of the up-down signal XUD may be transmitted to the analog level detector 130 at each period. The analog level detector 130 may output a duty error value Du_Err obtained by subtracting a target duty value TDUTY from the duty value VDUTY of the up-down signal XUD.

Figure 4:
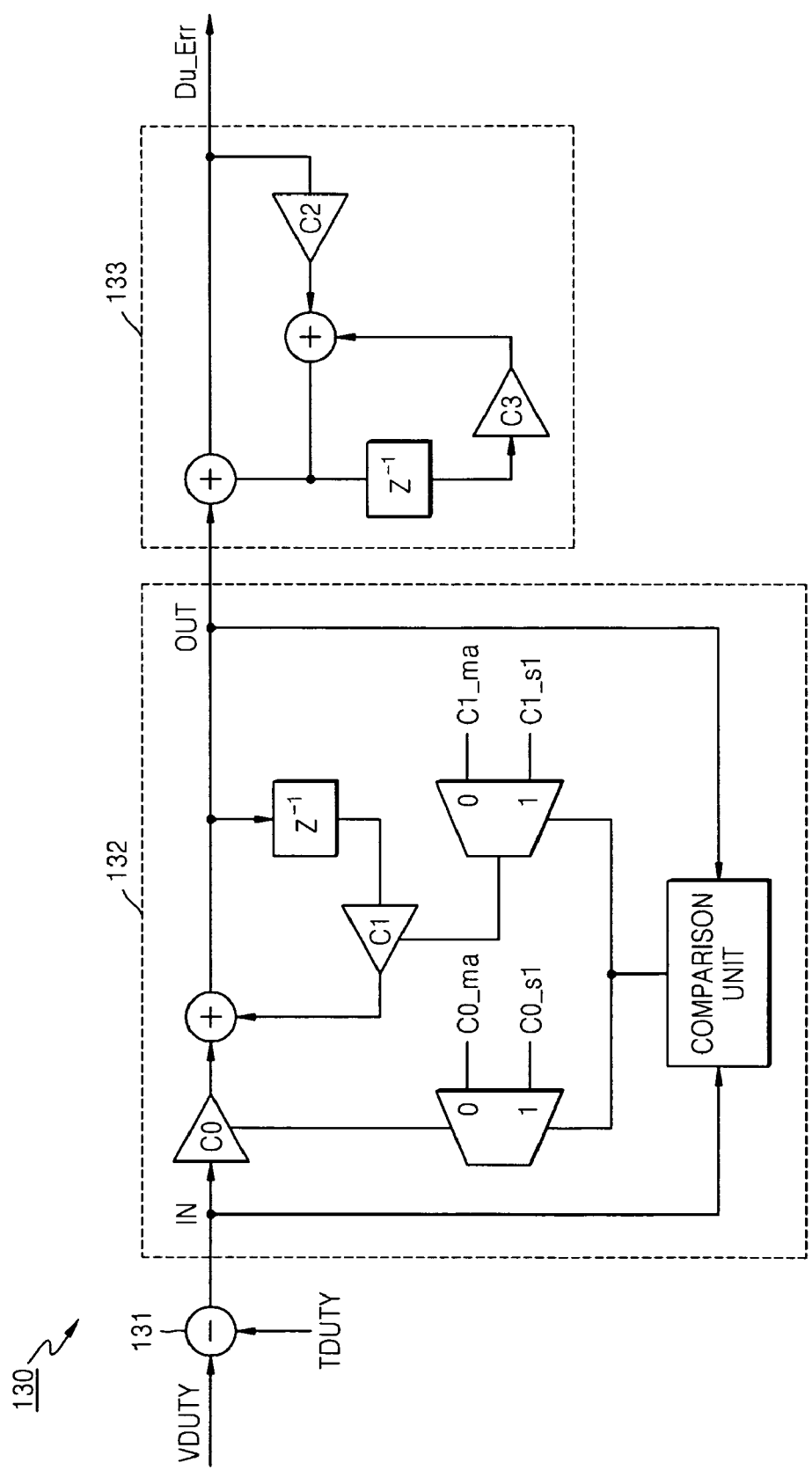
FIG. 4 is an example diagram showing an analog level detector shown in FIG. 3 according to an example embodiment.

FIG. 4 is an example diagram showing an analog level detector shown in FIG. 3 according to an example embodiment.

Referring to FIGS. 3 and 4, the analog level detector 130 may include a subtracter 131, a low pass filter 132 and/or a residual accumulation integrator 133.

The subtracter 131 may output the duty error value (Du_Err) obtained by subtracting a target duty value TDUTY from the duty value VDUTY of the up-down signal XUD. The target duty value TDUTY may be set to correspond to a target voltage of the analog signal XANAL to be measured.

The target voltage may be the voltage of the analog signal XANAL to be measured. Accordingly, the target voltage may be a peak/bottom voltage of the analog signal. However, the target voltage may be set to 90% or 99% of the peak/bottom voltage of the analog signal XANAL.

The low pass filter 132 may filter the duty error value Du_Err. For example, the low pass filter 132 may remove ripples of the duty error value Du_Err. The residual accumulation integrator 133 may output and hold the filtered duty error value Du_Err.

The low pass filter 132 may include a comparison unit. The comparison unit may compare the magnitude of the input of the low pass filter 132 with the magnitude of the output of the low pass filter 132. The comparison unit may set different weights for gains (C0, C1) of the low pass filter according to the comparison result of the magnitude of the input and the output of the low pass filter 132.

For example, at first, the duty error value Du_Err may be +1 as for the input IN of the low pass filter 132, and then the duty error value Du_Err may be −1 as for the input IN of the low pass filter 132.

In the low pass filter 132 according to an example embodiment, the magnitude of the input IN may be less than the magnitude of the output OUT, so the low pass filter 132 may set a weight 1 (C0_ma) for C0 and set a weight 0.1 (C1_s1) for C1. The output OUT may be as follows: $((+1) \times 1) + ((-1) \times 0.1) = 0.9$. Accordingly, the duty error value Du_Err may be detected as 0.9.

Alternatively, at first, the duty error value Du_Err may be −1 as for the input IN of the low pass filter 132, and then the duty error value Du_Err may be +1 as for the input IN of the low pass filter 132.

In the low pass filter 132 according to an example embodiment, the magnitude of the input IN may be greater than the magnitude of the output OUT, so the low pass filter 132 may set a weight 0.1 (C0_s1) for C0 and set a weight 1 (C1_ma) for C1. The output OUT may be as follows: $((-1) \times 1) + ((+1) \times 0.1) = (-0.9)$. Accordingly, the duty error value Du_Err may be detected as −0.9.

For example, the duty error value Du_Err may be varied with the periods, and/or the peak/bottom value of the ripples due to the variation of the duty error value Du_Err may be detected accurately, so an accurate duty error value Du_Err may be estimated.

Referring again to FIG. 3, the DAC 140 may convert the duty error value Du_Err into an analog signal with a corresponding voltage level and may output the converted analog signal as the reference voltage VREF by feedback. When the duty error value Du_Err is a desired or predetermined value of, for example, 0, the analog level meter 100 may output the reference voltage VREF as the detected value (for example, the target voltage) of the analog signal XANAL.

The analog level meter using a duty ratio according to an example embodiment may solve many problems due to analog signals without using an ADC. For example, it may be possible to resolve problems found in controlling offset or gain of the analog signal and/or inaccurate level detection.

The analog signal detection may be performed digitally, so a user may more easily deal with the detection of the analog signal level by setting the clock period and/or the target voltage.

Figure 5:
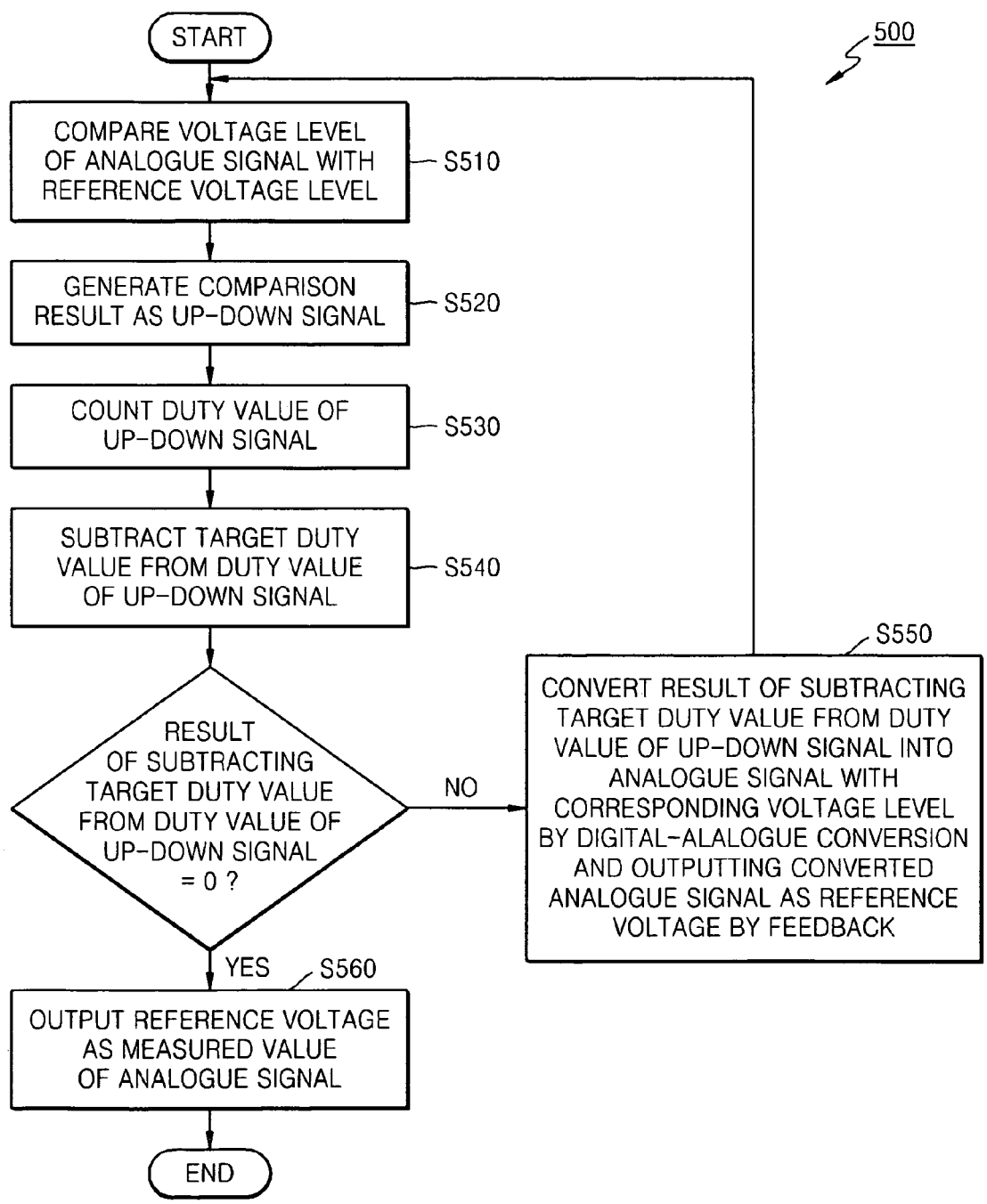
FIG. 5 is an example flow chart showing a method of measuring an analog signal level using a duty ratio according to an example embodiment.

FIG. 5 is an example flow chart showing a method of measuring an analog signal level using a duty ratio according to an example embodiment.

Referring to FIG. 5, a method 500 of measuring an analog signal level using a duty ratio according to an example embodiment may be a method of measuring a voltage level of the analog signal. The method may include comparing the voltage level of the analog signal with a reference voltage (S510), generating a comparison result as a up-down signal (S520), counting a duty value of the up-down signal (S530), subtracting a target duty value from the duty value of the up-down signal (S540), converting the result of subtracting a target duty value from the duty value of the up-down signal into another analog signal with the corresponding voltage level and outputting the converted analog signal as the reference voltage by feedback (S550), and/or outputting the result of converting the result of subtracting a target duty value from the duty value of the up-down signal into the another analog signal with the corresponding voltage level as a measured value of the analog signal, if the result of subtracting the target duty value from the duty value of the up-down signal is a desired or predetermined value (S560) (For example, outputting the reference voltage as a measured value of the analog signal, if the result of subtracting the target duty value from the duty value of the up-down signal is a desired or predetermined value).

When the analog voltage level is higher than the reference voltage, the up-down signal may be positive, and when the analog voltage level is lower than the reference voltage, the up-down signal may be negative.

In counting the duty value of the up-down signal (S530), when the up-down signal is positive, the duty value of the up-down signal may be increased by one. Alternatively, in counting the duty value of the up-down signal (S530), when the up-down signal is negative, the duty value of the up-down signal may be decreased by one.

Counting the duty value of the up-down signal (S530) may be performed at each desired or predetermined clock. The target duty value may be set to correspond to the target voltage of the analog signal.

A method of measuring an analog signal level using a duty ratio according to an example embodiment may exist within the sprit or scope of the aforementioned analog level meter. Accordingly, a method of measuring an analog signal level according to an example embodiment will be understood from the foregoing description, so a detailed description about the method of the measuring an analog signal level according to an example embodiment will be omitted.

As described above, the voltage level of the analog signal may be measured by the analog level meter of example embodiments without an ADC. A method of measuring an analog signal level using a duty ratio according to an example embodiment without an ADC may be used. Accordingly, sizes of the apparatuses and/or cost may be reduced.

Noise and/or offset voltage may be minimized through the digital process. Because the user has only to set the target duty value differently in order to change the voltage value to be measured, the user may more easily change the voltage value to be measured and/or measure the accurate voltage value.

Although example embodiments have been shown and described in this specification and figures, it would be appreciated by those skilled in the art that changes may be made to the illustrated and/or described example embodiments without departing from their principles and spirit, the scope of which is defined by the claims and their equivalents.

What is claimed is:

1. An analog level meter comprising:
a comparator comparing a voltage level of an analog signal with a reference voltage and generating an up-down signal;
a duty counter counting a duty value of the up-down signal;
an analog level detector outputting a duty error value obtained by subtracting a target duty value from the duty value of the up-down signal; and
a digital to analog converter DAC converting the duty error value into another analog signal with a corresponding voltage level and outputting the converted another analog signal as the reference voltage by feedback,
wherein the analog level meter outputs the reference voltage as a measured value of the analog signal when the duty error value is a value.

2. The analog level meter of claim 1, wherein the analog level meter outputs the reference voltage as a measured value of the analog signal when the duty error value is 0.

3. The analog level meter of claim 1, wherein the up-down signal is positive when the voltage level of the analog signal is higher than the reference voltage, and
wherein the up-down signal is negative when the voltage level of the analog signal is lower than the reference voltage.

4. The analog level meter of claim 3, wherein the duty counter increases the duty value by one when the up-down signal is positive, and
wherein the duty counter decreases the duty value by one when the up-down signal is negative.

5. The analog level meter of claim 1, wherein the target duty value is set to correspond to a target voltage of the analog signal.

6. The analog level meter of claim 5, wherein the target voltage is a peak voltage or a bottom voltage of the analog signal.

7. The analog level meter of claim 1, wherein the duty counter counts in synchronization with a clock.

8. The analog level meter of claim 1, wherein the analog level detector includes
a subtracter outputting the duty error value obtained by subtracting the target duty value from the duty value of the up-down signal;
a low pass filter filtering the duty error value; and
a residual accumulation integrator outputting and holding the filtered duty error value.

9. The analog level meter of claim 8, wherein the low pass filter sets different weights for gains of the low pass filter by comparing the magnitude of the input of the low pass filter with the magnitude of the output of the low pass filter.

10. The analog level meter of claim 1, further comprising:
a latch unit latching the duty value of the up-down signal at each period in response to an update signal.

11. The analog level meter of claim 10, further comprising:
an update signal generator generating the update signal at the each period.

12. The analog level meter of claim 11, further comprising:
a reset unit generating a reset signal for resetting the duty counter at the each period.

13. The analog level meter of claim 12, wherein the reset unit generates the reset signal by delaying the update signal.

14. A method of measuring a voltage level of an analog signal, the method comprising:
   comparing the voltage level of the analog signal with a reference voltage;
   generating the comparison result as an up-down signal;
   counting a duty value of the up-down signal;
   subtracting a target duty value from the duty value of the up-down signal;
   converting the result of subtracting the target duty value from the duty value of the up-down signal into another analog signal with a corresponding voltage level and outputting the converted another analog signal as the reference voltage by feedback; and
   outputting the reference voltage as a measured value of the analog signal when the result of subtracting the target duty value from the duty value of the up-down signal is a value.

15. The method of claim 14, wherein the up-down signal is positive when the voltage level of the analog signal is higher than the reference voltage, and
   wherein the up-down signal is negative when the voltage level of the analog signal is lower than the reference voltage.

16. The method of claim 15, wherein counting a duty value of the up-down signal includes
   increasing the duty value of the up-down signal by one when the up-down signal is positive, and
   decreasing the duty value of the up-down signal by one when the up-down signal is negative.

17. The method of claim 14, wherein counting a duty value of the up-down signal is synchronized with a clock.

18. The method of claim 14, wherein the target duty value is set to correspond to a target voltage of the analog signal.

* * * * *